United States Patent [19]

Eilert et al.

[11] Patent Number: 5,015,829

[45] Date of Patent: May 14, 1991

[54] KEY PAD AND FRONT PANEL ASSEMBLY FOR AN ELECTRONIC INSTRUMENT

[75] Inventors: Randall N. Eilert; Wilbur R. Ames, IV, both of Lake Stevens, Wash.

[73] Assignee: Hewlett-Packard Company, Palo Alto, Calif.

[21] Appl. No.: 344,884

[22] Filed: Apr. 28, 1989

[51] Int. Cl.[5] ........................ G06C 7/02; H01H 13/00; H05K 10/00

[52] U.S. Cl. .................................... 235/1 D; 200/5 A; 200/308; 235/145 R; 361/380

[58] Field of Search .............. 200/5 R, 5 A, 329, 341, 200/343, 345, 293–296, 308; 361/331, 332, 380, 397, 399; 235/1 D, 145 R

[56] References Cited

U.S. PATENT DOCUMENTS

| | | | |
|---|---|---|---|
| 3,643,041 | 2/1972 | Jackson | 200/600 X |
| 3,699,294 | 10/1972 | Sudduth | 200/5 A X |
| 4,066,850 | 1/1978 | Heys, Jr. | 200/5 A |
| 4,066,851 | 1/1978 | White et al. | 200/5 A |
| 4,231,098 | 10/1980 | Tanimoto | 200/5 A X |
| 4,570,521 | 2/1986 | Fox | 200/5 A X |
| 4,820,887 | 4/1989 | Schmitz | 200/43.18 |
| 4,836,256 | 6/1989 | Meliconi | 235/1 D X |

*Primary Examiner*—J. R. Scott

[57] ABSTRACT

A front panel assembly for an electronic instrument having a one-piece key pad with a plurality of protuberances thereon. The protuberances are formed in groups according to function and all protuberances in a group are positioned in proximity to each other. Each group of protuberances has a header protruberance defining the function of the group. Each protrusion, except the header protuberances has a corresponding electrical switching member connectably attached thereto. Each protuberance, except the header protrusions, functions as a key. When a key protuberance is pressed, the corresponding electrical switching member is pressed into operative engagement with a corresponding circuit on the circuit board. An alternate embodiment allows one group of keys to be replaced with a rotary dial without remaking the key pad.

8 Claims, 2 Drawing Sheets

KEY PAD AND FRONT PANEL ASSEMBLY FOR AN ELECTRONIC INSTRUMENT

BACKGROUND OF THE INVENTION

The front panels of electronic equipment typically include a metal or plastic outer cover with a number of keys positioned to extend through holes in the outer cover. The individual keys each have a mechanical switch positioned on the rearward surface, and the individual keys are all encased within a metal tray. Positioned behind the keys is a printed circuit board. When an individual key is pressed, a metal plate on the rearward surface of the key comes into contact with one of the circuits on the printed circuit board at an appropriate point, thereby connecting two switch paths on the printed circuit board and completing the circuit to accomplish the function of the key that was pressed. In manufacturing this type of equipment, the outer cover of the front panel is enclosed in metal as are the keys. Each individual switch is then individually connected at the appropriate position on the key board. An alternate form of manufacture is to form all the keys on a single one-piece key pad wherein the key pad has a plurality of keys positioned on the forward surface thereof. The key pad typically has a front panel associated therewith, the front panel having a plurality of holes corresponding to the plurality of keys and each hole is adapted to receive a corresponding key so that each key protrudes through the front panel. Each key on the one-piece key pad has a corresponding conductive carbon pill positioned on the rearward surface of the one-piece key pad. The corresponding conductive carbon pills are adapted to be positioned on the appropriate corresponding position on the printed circuit board thereby eliminating the need to have each key individually connected on the appropriate position on the printed circuit board. The front panel associated with such key pads typically present the various keys divided in groups according to function. The front panel has silk-screened indicia or headers above a particular group of keys to indicate the function of that group of keys thus requiring the silk-screening of these headers on the front panel. This procedure is expensive in additional silk-screening costs and labor associated with the process. The procedure is typically expensive in materials and an extremely labor intensive operation thus making it costly and inefficient.

SUMMARY OF THE INVENTION

In order to overcome the problems hereinbefore described, there has been provided by the applicants' invention a new and novel key pad and front panel assembly which combines all keys and their corresponding conductive carbon pills on one rubber silicone key pad. The keys are in the form of protuberances on top of the rubber silicone pad. These, protuberances are adapted to protrude through the holes in the front panel. The corresponding conductive carbon pills are positioned on the rearward surface of the key pad and are adapted to be positioned on the appropriate corresponding positions on the printed circuit board. This invention therefore eliminates the need for additional metal encasing and reduces labor by eliminating the need to have each key individually connected on the appropriate position on the printed circuit board. The cost and complexity of the manufacturing process is thereby greatly reduced. The present invention allows for keys to be placed in groups with one protuberance per group as a header carrying indicia indicating the function of that group of keys. All headers are included on the key pad without the necessity for individual manufacture of the headers. This saves the necessity of manufacturing another panel to carry graphics indicating the function for the various groups of keys and eliminates the need for additional silk screening on the front panel and provides a unique three dimensional appearance of these headers.

It is therefore an object and advantage of the present invention to provide a lower cost front panel assembly with lower material costs in manufacture.

Another object and advantage of the present invention is to provide a front panel assembly which is less labor intensive in manufacture.

A further object and advantage of the present invention is to eliminate the requirement for a separate panel for graphics designating the various function groups for the keys.

Yet another object and advantage of the present invention is to provide a front panel and key pad which provides information for key groups.

Still yet another object and advantage of the present invention is to provide a front panel assembly and key pad which gives a unique three-dimensional appearance.

These and other objects and advantages will become apparent from a review of the drawings and from a study of the specification portion hereinafter describing the preferred embodiment of the invention.

DESCRIPTION OF THE PREFERRED EMBODIMENT

Figure 1:
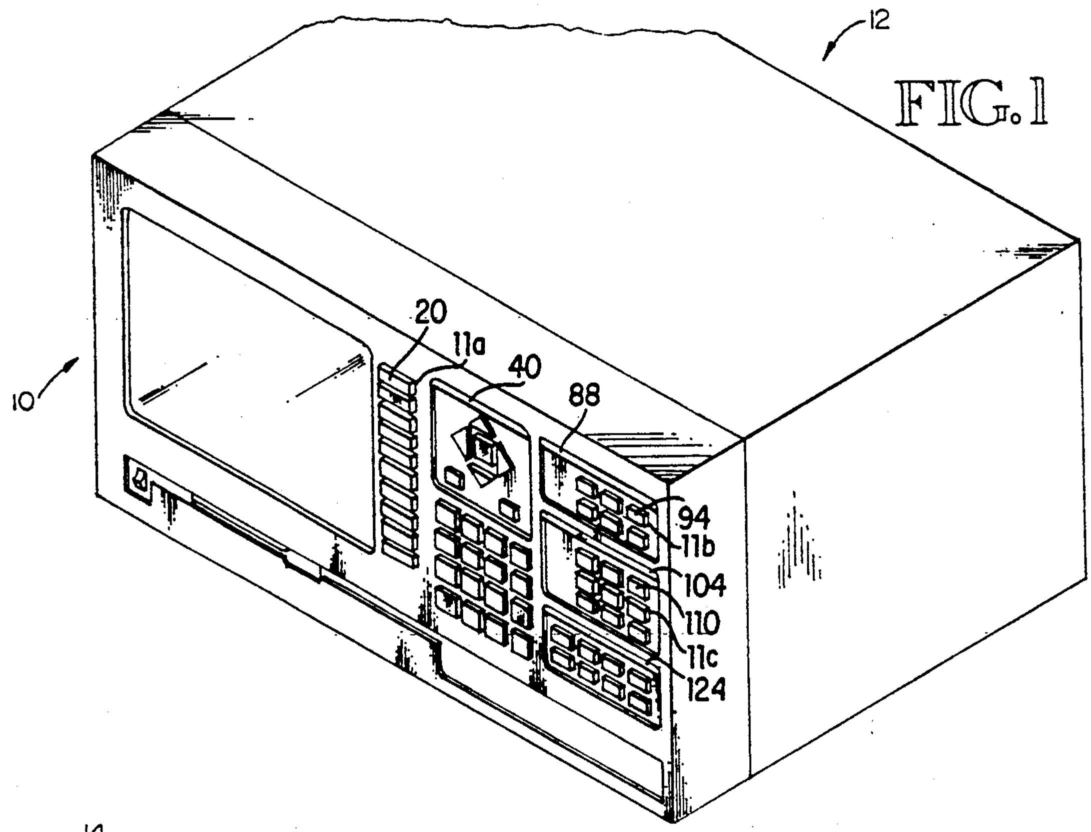
FIG. 1 is a perspective view of the present front panel assembly as it is used on an electronic instrument.
Figure 4:
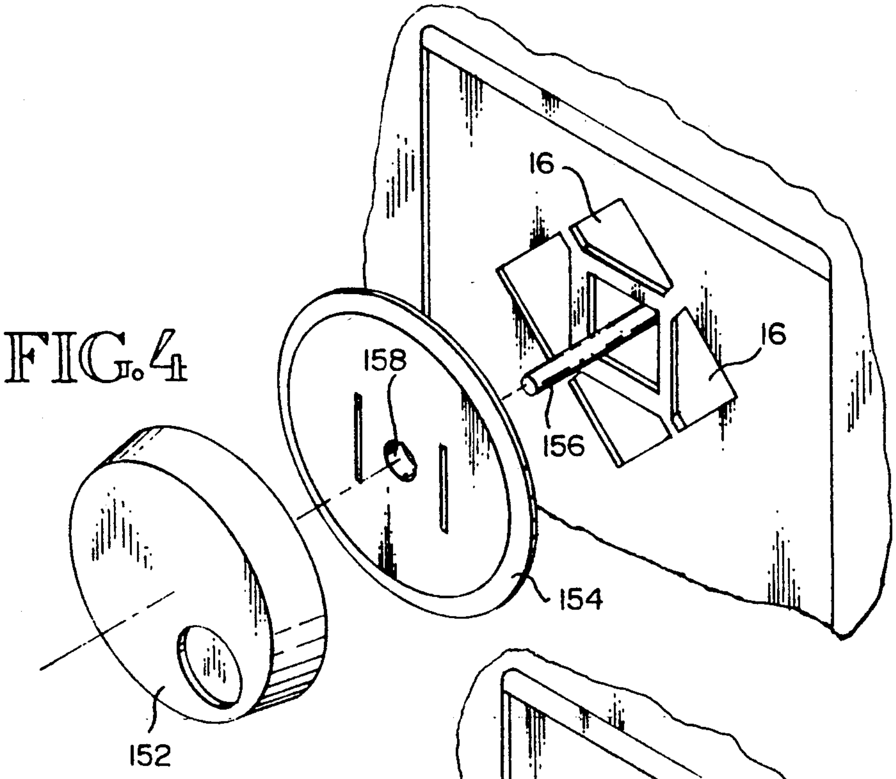
FIG. 4 is an exploded perspective view of an alternate embodiment of the present invention wherein instead of marker or cursor control keys a dial knob is substituted on the front panel assembly of the present invention.

Referring now to the drawings in general and in particular to FIG. 1 of the drawings, there is shown a perspective view of the front panel assembly shown generally by the numeral 10. The front panel assembly 10 is positioned on the front of an electronic instrument 12. The front panel has a plurality of holes, such as shown at 11*a*, 11*b*, and 11*c* in FIG. 1, with protuberances, such as shown at 20, 94, and 110, positioned therethrough. The protuberances are formed on the key pad 14 as shown most clearly in FIG. 2. Each protuberance on the key pad 14 has a corresponding hole 16 as seen most clearly in the alternate embodiment of the invention as shown in FIG. 4.

Figure 2:
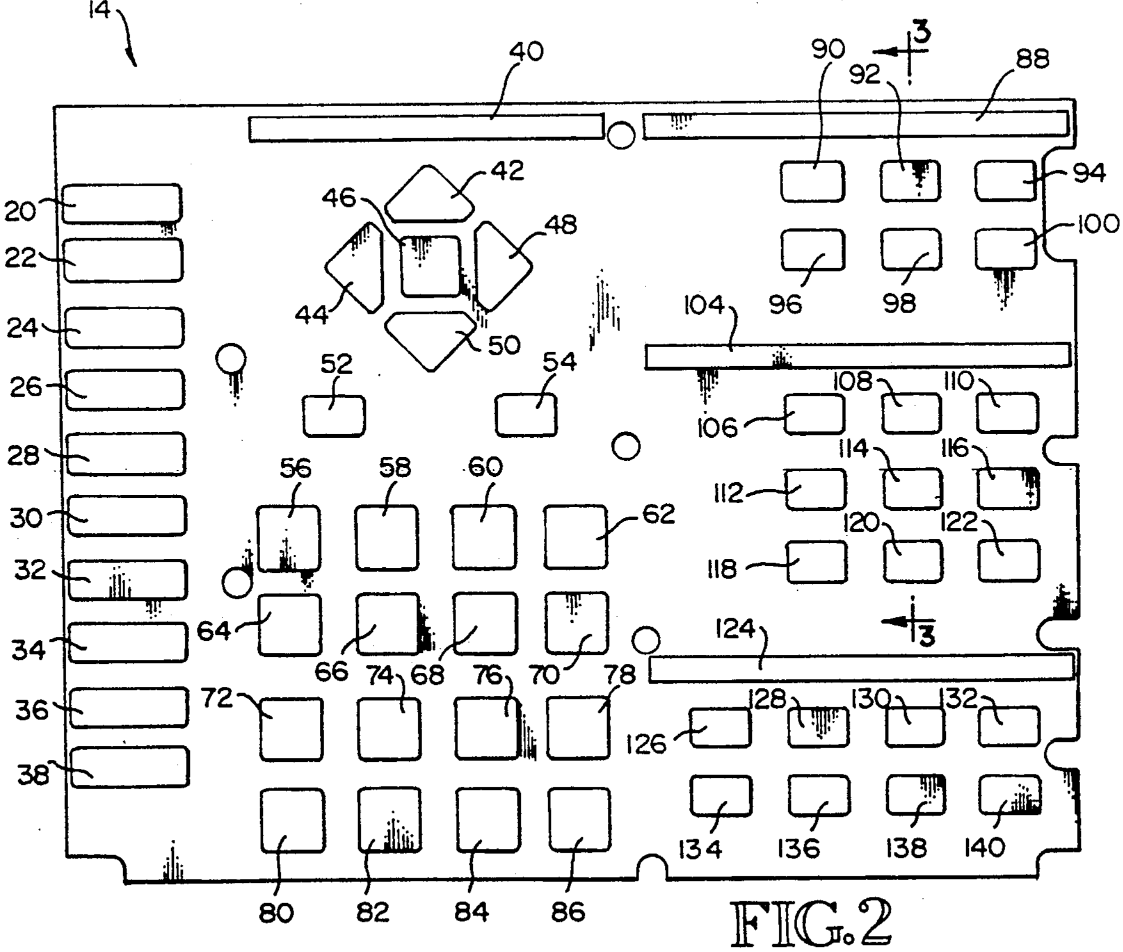
FIG. 2 is a front elevation view of the key pad of the present front panel assembly.

FIG. 2 is a front elevation view of the key pad of the present invention showing the plurality of protuberances positioned on the forward surface of the key pad.

In the preferred embodiment of the present invention, the protrusions 20, 22, 24, 26, 28, 30, 32, 34, 36, and 38 function as menu keys. The keys 42, 44, 46, 48, 50, 52, and 54 function as marker or cursor control keys with protuberance 40 functioning only as a header to indicate the function of the keys directly below 42, 44, 46, 48, 50, 52, and 54. Thus, the protuberances 42, 44, 46, 48, 50, 52, and 54 each have a corresponding conductive pill positioned on the rearward surface of the key pad as shown most clearly in FIG. 3, while the header protuberance 40 would not have a corresponding conductive pill positioned behind as its purpose is simply to indicate the function of the keys directly below it. The protuberances positioned directly below the marker or cursor control keys 56, 58, 60, 62, 64, 66, 68, 70, 72, 74, 76, 78, 80, 82, 84, 86 function as numerical input keys. The numerical input protuberances do not require a header protuberance similar to that described with reference to the marker protuberances. In a manner similar to that described with reference to the marker or cursor control keys, protuberance 40 is the header protuberance for the numerical input keys. Similarly, there are also provided protuberances 90, 92, 94, 96, 98, and 100, which function as display keys with protuberance 88 serving only to indicate the function of the keys directly below it. In the present example, the protuberance 88 would indicate Display as the function of the protuberances or keys directly below it. In a like manner, keys 106, 108, 110, 112, 114, 116, 118, 120, and 122 function as measurement keys in the present example, with the protuberance 104 serving as a header to indicate the function of the keys directly below it. Also, the protuberances 126, 128, 130, 132, 134, 136, 138, and 140 function as system keys in the present example with the protuberance 124 serving to indicate the system function of the keys grouped directly below it.

Figure 3:
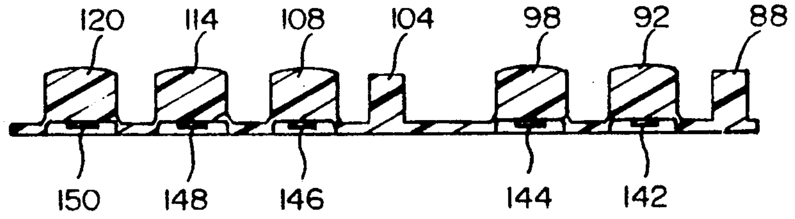
FIG. 3 is a cross-sectional view, taken along line 3—3 of FIG. 2, showing one column of protuberances positioned on the key pad of the present invention. Two of the protuberances shown in FIG. 3 are used as headers.

Referring now to FIG. 3 of the drawings, there is shown a cross-sectional view taken through line 3—3 of FIG. 2 showing the middle column of the display and measurement function groups of the keys. What is seen, therefore, in FIG. 3 is a cross-sectional view of protuberances 88, 92, 98, 104, 108, 114, and 120. As seen in FIG. 3, the protuberances 88 and 104 which function as headers do not have corresponding conductive pills positioned on the rearward surface of the key pad since the header protuberance 88 and 104 are not electronically connected to the circuit board. However, the protuberances 92, 98, 108, 114, and 120, which serve to perform a particular function associated with the electronic instrument, each have a corresponding conductive pill 142, 144, 146, 148, and 150. Each conductive pill is adapted to be positioned on an appropriate corresponding position on the printed circuit board associated with the instrument. Thus, as one of the functional protuberances 92, 98, 108, 114, and 120 in FIG. 3 is pressed, the corresponding conductive pill 142, 144, 146, 148, or 150 is lowered into engagement at the appropriate corresponding position on the printed circuit board, therefore completing a circuit to perform the function as required by the particular key.

Referring now to FIG. 4 of the drawings, there is shown an exploded perspective view of an alternate embodiment of the present invention wherein, instead of marker or cursor control keys, a dial knob is substituted on the front panel assembly of the present invention. The dial knob includes an outer dial member 152, an inner retaining member 154 and a post 156. The post 156 is inserted through the hole in the front panel which would correspond to protuberance 46. The post 156 is adapted to be inserted through a central hole 158 in the inner retaining member 154 and then into a receiving hole in the back side of the outer dial member 152. The inner retaining member 154 is adapted to be snap-fit to the outer dial member 152 by means of two edge engaging members (not shown) positioned on the rearward surface of the inner retaining member 154. The inner retaining member 154 serves two purposes; first it covers the holes that would correspond to protuberances 42, 44, 48 and 50 in the preferred embodiment, and, second, the inner retaining member 154 provides slack for the post 156 so that the outer dial member 152 does not wobble on the post 156.

Figure 5:
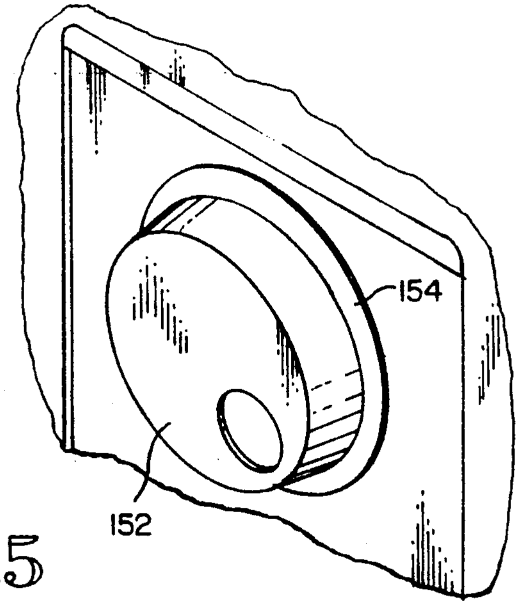
FIG. 5 is a perspective view similar to FIG. 4 showing the dial knob after it is positioned on the front panel assembly of the present invention.

FIG. 5 is a perspective view similar to FIG. 4 showing the dial knob after it is positioned on the front panel assembly of the present invention. It can be seen in FIG. 5 that the holes which corresponded to protuberances 42, 44, 48, and 50 of the preferred embodiment have been covered and are out of the sight of the user. Thus, in the alternate embodiment as shown in FIGS. 4 and 5, a dial knob application has been substituted for a marker or cursor control type application wIth no additional manufacture of a separate key pad.

In the preferred embodiment of the present invention the key pad is molded of silicone rubber and the protuberances have indicia imprinted thereon to indicate the function of the key. In the preferred embodiment, the header protuberances are approximately 3/16 inch and the functional protuberances or keys vary from approximately $\frac{1}{4}$ inch to $\frac{1}{2}$ inch.

A method of keying an electronic key pad is also disclosed wherein the before-described key pad is used having a plurality of protuberance, each protuberance being positioned adjacent to a corresponding electrical switching member wherein each protrusion functions as a key and each protuberance is positioned through corresponding holes in a front panel of an electronic instrument. The protuberance are positioned in groups according to function, all protuberance in a group are positioned in proximity to each other, and there is provided a header protuberance for each group defining the function of the group. A protuberance is pressed to thereby actuate the corresponding conductive carbon pill into operative engagement with a corresponding circuit on the printed circuit board.

From the foregoing, it can be seen that there has been accomplished by the applicant's invention all of the objects and advantages of the invention. Nevertheless, variations in the structure of the invention and the arrangement of the various parts are within the spirit and scope of the applicants' invention. The embodiments given have been given only by way of illustration and the applicant is not to be limited to the embodiments shown and described.

Having described our invention, we claim:

1. A panel assembly for an electronic instrument comprising:

a panel having a group of holes formed therein; and a pad having a group of attached protuberances protruding from one side of the pad, the protuberances being positioned so that each hole has a protuberance extending through it whenever the panel and pad are assembled together, some of the group of protuberances being movable relative to the panel and pad assembly, at least one of the protuberances being substantially immovable relative to the panel and pad assembly.

2. The assembly of claim 1 wherein the protuberances that are attached for movement relative to the panel and pad assembly are connected to conductive elements.

3. The assembly of claim 1 wherein the substantially immovable protuberance carries indicia indicating the function of the movable protuberances.

4. A panel assembly for an electronic instrument or the like, comprising:

a panel having a group of holes formed therein; and a pad having a group of attached protuberances protruding from one side of the pad, the protuberances on the pad being positioned so that each protuberance on the pad extends through an associated hole in the panel whenever the pad and panel are assembled together, some but not all of the protuberances being connected to conductive elements.

5. The assembly of claim 4 wherein the protuberances that are connected to conductive elements are attached to the pad for movement relative to the panel and pad assembly.

6. The assembly of claim 4 wherein the protuberances that are not connected to conductive elements carry indicia indicating the function of the protuberances that are connected to conductive elements.

7. The assembly of claim 4 wherein the pad includes an aperture formed therethrough, the aperture being aligned with one of the holes in the panel when the pad and panel are assembled together the aligned hole and aperture providing clearance for a post member to extend through the assembled pad and panel.

8. The assembly of claim 7 wherein the pad includes a group of apertures formed therein, each aperture being aligned with an associated hole in the panel whenever the panel and pad are assembled together, the assembly further comprising:

a dial member attachable to the panel and sized to cover the aligned holes and apertures, and attachment means for attaching the dial member to the assembly.

* * * * *